United States Patent [19]
Motonami

[11] Patent Number: 5,365,474
[45] Date of Patent: Nov. 15, 1994

[54] SEMICONDUCTOR MEMORY DEVICE

[75] Inventor: Kaoru Motonami, Hyogo, Japan

[73] Assignee: Mitsubishi Denki Kabushiki Kaisha, Tokyo, Japan

[21] Appl. No.: 135,638

[22] Filed: Oct. 14, 1993

[30] Foreign Application Priority Data

Oct. 21, 1992 [JP] Japan .................. 4-282778
Jul. 28, 1993 [JP] Japan .................. 5-186270
Sep. 22, 1993 [JP] Japan .................. 5-236553

[51] Int. Cl.$^5$ ............................ G11C 13/00
[52] U.S. Cl. ........................ 365/51; 365/149; 365/182; 365/230.08
[58] Field of Search .............. 365/51, 149, 150, 182, 365/189.01, 230.01, 189.05, 230.08

[56] References Cited

U.S. PATENT DOCUMENTS 5,265,045 11/1993 Nishio et al. ............ 365/51

FOREIGN PATENT DOCUMENTS 64-19762 7/1987 Japan .
4-23357 5/1990 Japan .

Primary Examiner—Terrell W. Fears
Attorney, Agent, or Firm—Lowe, Price, LeBlanc & Becker

[57] ABSTRACT

An improved semiconductor memory device which can increase the capacitor capacitance and improve the processing accuracy of a storage node can be obtained. The device includes a plurality of first field regions which are formed at a predetermined pitch in the running direction of bit line. A plurality of second field regions are formed adjacent to and parallel to the rows formed by the plurality of first field regions, and formed at the same pitch as above. The first field regions and the second field regions are formed shifted from each other by ¼ pitch in the running direction of bit line. A stacked-type capacitor having bit line buried under cell plate electrode is provided in the first field regions and the second field regions.

7 Claims, 23 Drawing Sheets

SEMICONDUCTOR MEMORY DEVICE

BACKGROUND OF THE INVENTION

1. Field of the Invention

The present invention generally relates to a semiconductor memory device, and more particularly to a buried bit line-type semiconductor memory device which is improved in order to increase the processing accuracy of a storage node.

2. Description of the Background Art

Lately, a demand for semiconductor memory devices has been increased rapidly thanks to the spread of information devices such as a computer. Functionally, the semiconductor memory device having a large storage capacity and operating at a high operational speed is required. Accordingly, development of the technology for high integration, quick response and high reliability of the semiconductor memory device has been carried out.

Among semiconductor memory devices, a DRAM (Dynamic Random Access Memory) which allows random input/output of memory information is known. Generally, a DRAM includes a memory cell array which is a memory region storing a large amount of memory information and a peripheral circuitry which is required for external input-output.

FIG. 1 is a block diagram showing a structure of a general DRAM. Referring to FIG. 1, a DRAM 50 includes a memory cell array 51 storing data signals of the memory information, a row and column address buffer 52 for receiving an external address signal (a signal for selecting a memory cell constituting an unit memory circuit), a row decoder 53 and a column recorder 54 for designating the memory cell by decoding the address signal, a sense refresh amplifier 55 for amplifying and reading the signal stored in the designated memory cell, a data-in buffer 56 and a data-out buffer 57 for data input/output, and a clock generator 58 generating a clock signal.

Memory cell array 51 occupies a large area on a semiconductor chip. A plurality of memory cells each storing unit memory information are provided in a matrix in memory cell array 51.

FIG. 2 is an equivalent circuit for 4 bits of memory cells constituting the memory cell array. The memory cell shown is a so-called 1 transistor-to-1 capacitor type memory cell which is structured with one field effect transistor and one capacitor connected thereto. This type of memory cell has a simple structure so that higher degree of integration of the memory cell array can easily be improved, and thus it is often used in a DRAM which requires a large capacity.

Referring to FIG. 3, such transistor and capacitor are formed within a field region 2a in the surface of a semiconductor substrate 1. One field region 2a is isolated from another field region 2a by an isolation oxide film 2.

In table 1 below, characteristics of various semiconductor devices described in this specification are listed. First, second, and third conventional examples will be described below, followed by the description of the present invention.

TABLE 1

|  | Vertical Structure | Plane Layout of the field region |
| --- | --- | --- |
| 1st conventional example | unburied bit line-type stacked cell structure | half pitch arrangement structure |
| 2nd conventional example | buried bit line-type stacked cell structure | half pitch arrangement structure |
| 3rd conventional example | buried bit line-type stacked cell structure | half pitch arrangement structure (an obliquely arranged field region) |
| Present Invention | buried bit line-type stacked cell structure | quarter pitch arrangement structure |

First Conventional Example

FIG. 4 is a plan view of a semiconductor device according to a first conventional example, and FIG. 5 is a sectional view of FIG. 4 taken along line A-B.

Referring to these drawings, the semiconductor device includes a word line 4 and a bit line 15 which cross each other. A transfer gate transistor and a stacked type capacitor are provided in the vicinity of the crossing of word line 4 and bit line 15. The transfer gate transistor includes a pair of source/drain regions 6, 6 which are formed in the surface of silicon substrate 1, and a gate electrode (a word line) 4 which is formed on the surface of silicon substrate 1 with an insulating layer posed therebetween.

The stacked type capacitor contacts one of the source/drain regions 6, and includes a storage node (a lower electrode) 11 which is extending to the upper portion of gate electrode 4. A contact portion of storage node 11 and source/drain region 6 is called a storage node contact 50. A capacitor insulating film 12 covers the surface of storage node 11. A cell plate 13 is provided over storage node 11 with capacitor insulating film posed therebetween.

An interlayer insulating film 20 is provided on silicon substrate 1 to cover the transfer gate transistor and the stacked capacitor. A bit line contact hole 52 is provided in interlayer insulating film 20 for exposing a bit line contact 51. Bit line 15 is connected to one of the source/drain regions 6 through bit line contact hole 52. Source/drain regions 6, bit line contact 51, and storage node contact 50 are formed within field region 2a.

One field region 2a is isolated from another field region 2a by field oxide film 2.

FIG. 6A is a plan view of the semiconductor device showing the entire field region 2a which is taken out from FIG. 4 for easier understanding. FIG. 6B is a sectional view taken along line B—B in FIG. 6A.

Referring to FIGS. 4, 6A, and 6B, a plurality of field regions 2a are disposed at a predetermined pitch in the direction where bit line 15 runs. Next to a row of field region 2a indicated by a reference character a, a field region 2a indicated by reference character b is provided in parallel. Also, next to a row of field region indicated by a reference character b, a field region 2a indicated by a reference character c is provided. Field region 2a indicated by the reference character a and field region 2a indicated by the reference character b are formed shifted from each other by ½ pitch in the running direction of a bit line.

As for the relationship between a row of the field region indicated by the reference character b and the field region indicated by the reference character c, field region 2a indicated by the reference character b and field region 2a indicated by the reference character c are also formed shifted from each other by ½ pitch.

FIG. 7 shows an arrangement of field regions 2a in the vicinity of the contact portion of bit line 15 and sense amplifier 54 of a close packed folded bit-line cell array.

In the semiconductor memory device having a half pitch arrangement structure as well as unburied bit line-type stacked cell structure such as shown in FIG. 4 (the first conventional example), it is necessary to increase a dimension SNx (a length of the storage node) and a dimension SNy (a width of the storage node) in order to increase the capacitance of the capacitor. However, predetermined dimensions of SNmin (a distance between two adjacent storage nodes) and SNcp (a distance from an end of the storage node to an end of the cell plate) should be reserved, so that there is a limitation for increasing SNx. Thus in the semiconductor memory device according to the first conventional example, it was difficult to reserve a sufficient capacitance of the capacitor because SNx could not be increased.

Although a close packed folded bit-line cell array of quarter pitched arrangement immune to noise is disclosed (The Institute of Electronics, Information and Communication Engineers of Japan, National Spring Meeting, 1991, C-665), a field region with a quarter pitched arrangement, and a buried bit line type stacked cell are not disclosed.

Second Conventional Example

In order to solve the problem of the first conventional example, a semiconductor memory device having a buried bit line-type stacked cell structure and a half pitch arrangement structure such as shown in FIG. 8 has been suggested as a second conventional example.

FIG. 9 is a sectional view taken along line A-B in FIG. 8, and FIG. 10 is a sectional view taken along line C-D in FIG. 8. In these figures, like reference numerals are given to the portions which are identical or corresponding to the members indicated in FIGS. 4 and 5.

Referring to these figures, the feature of the semiconductor memory device according to the second conventional example is that a cell plate 13 is formed above bit line 15, and thus bit line 15 is buried under cell plate 13. In the structure like this, there is no limitation for the dimension SNcp, so that the dimensions SNx and SNy can be increased. However, if the dimensions SNx and SNy are increased to the limit of processing accuracy of the storage node, the accuracy of processing storage node 11 will be deteriorated, because an end of storage node 11 is positioned close to bit line contact portion 51.

In order to solve the problem, a semiconductor device according to a third conventional example has been suggested. Prior to the description of the semiconductor device according to the third conventional example, a manufacturing process of the unburied bit line-type semiconductor device shown in FIG. 4 and a manufacturing process of the buried bit line-type semiconductor device shown in FIG. 8 will be compared with each other in the description below.

FIG. 11A schematically shows a manufacturing process of the unburied bit line-type stacked cell. The unburied bit line-type semiconductor device is manufactured through the steps of forming a field oxide film (155), forming a transfer gate (156), forming a storage node (157), forming a cell plate (158), and forming a bit line (159) in turn. Meanwhile, the buried bit line-type device is manufactured through the steps of forming a field oxide film (155), forming a transfer gate (156), forming a bit line (159), forming a storage node (157), and forming a cell plate (158) in turn, as shown in FIG. 11B.

Third Conventional Example

FIG. 12 is a plan view of a semiconductor memory device according to the third conventional example, and FIG. 13 is a sectional view taken along line A-B in FIG. 12. In FIG. 12, storage node 11 is supposed not to appear in the sectional view cut along line A-B: however, storage node 11 is shown in FIG. 13 for convenience, in order to clarify the characteristic part, although it is against the drawing rule.

The third conventional example has the buried bit line-type stacked cell structure and the half pitch arrangement structure as in the second conventional example. FIG. 14 shows the field region.

The third conventional example has such characteristics that a row of field region (a) and an adjacent row of field region (b) are formed shifted from each other by ½ pitch in the running direction of bit line 15 and that field region 2a is arranged obliquely to the running direction of bit line 15. In FIG. 14, the regions shown by dotted lines, which are for clarifying the shift of pitch, are phantom arrangements of the field regions assuming that field region 2a is not arranged obliquely.

In the third conventional example, source/drain regions 2a, the storage node contact, and the bit line contact are formed in the obliquely arranged field region, further detailed description of which will be given referring to FIGS. 12 and 13.

Referring to FIGS. 12, 13 and 14, field region 2a is arranged obliquely to the running direction of the bit line 15. Gate electrode 4 is formed on silicon substrate 1. Interlayer insulating film 20 is formed to cover gate electrode 4. Bit line contact hole 51h is formed in interlayer insulating film 20 in order to expose bit line contact 51. Bit line 15 is connected to one of the source/drain regions 6 through bit line contact hole 51h. Interlayer insulating film 18 is formed on silicon substrate 1 to cover bit line 15. Storage node 11, which is the lower electrode of the capacitor, is formed on interlayer insulating film 18. Storage node 11 is connected to the other one of the source/drain regions 6 by storage node contact 50 through storage node contact hole 50h which is formed in interlayer insulating films 18 and 20.

The problems of the semiconductor memory device according to the third conventional example will be described.

FIG. 15 is an enlarged perspective view of an end 11a of storage node 11 in FIG. 13. Referring to FIGS. 12, 13 and 15, the dimensions SNx and SNy should be increased to the limit of the processing accuracy in order to increase the plane area of storage node 11. When the dimensions SNx and SNy are increased, end 11a of storage node 11 is supposed to be located above bit line contact hole 51h.

FIG. 16 is a sectional view of the semiconductor device during patterning of storage node 11. A residue 11b of storage node 11 easily adheres to an inclined portion 18a in the recess in interlayer insulating film 18, because end 11a of the storage node is placed above bit line contact hole 51h. Storage node 11 and adjacent storage node 11 are connected by this residue 11b, and accordingly storage nodes 11 and 11 will be short-circuited.

The problem of a residue existing at inclined portion 18a is also found in FIG. 17 where storage nodes 11 are formed in a manner shifted to each other. More specifically, referring to FIG. 18 taken along line D—D of FIG. 17, an end 11a of storage node 11 is formed on a concave inclined portion 18a on interlayer insulating film 18. Therefore, as long as the half pitch arrangement structure is employed, the problem of residue at inclined portion 18a cannot be avoided no matter how the storage nodes are shifted with respect to each other.

Meanwhile, in the buried bit line-type semiconductor memory device shown in FIG. 13, the following problem has also occurred, i.e., in the buried bit line-type memory cell referring to FIG. 13, the interline capacitance between word line 4 and bit line 15 was increased because the word line 4 and bit line 15 come close to each other.

SUMMARY OF THE INVENTION

The present invention was made to solve the above described problems, and its object is to provide an improved buried bit line-type semiconductor memory device which can improve the processing accuracy of the storage node.

Another object of the present invention is to provide an improved buried bit line type semiconductor memory device in which the manufacturing accuracy of a storage node can be increased in a close packed folded bit-line cell array.

A further object of the present invention is to provide an improved buried bit line-type semiconductor memory device in which the signal propagation delay time of the word line can be made shorter in the buried bit line-type capacitor.

The present invention relates to a semiconductor memory device which carries out input/output of memory information by a memory cell which is provided at the crossing of a word line serving as a transfer gate, and a bit line serving as a data line. The semiconductor device includes a semiconductor substrate having a main surface. A field oxide film is provided in the main surface of the semiconductor substrate. In the main surface of the semiconductor substrate, a plurality of first field regions which are isolated from each other by the above field oxide film and formed at a predetermined pitch in the running direction of the bit line are provided. In addition, the device includes a plurality of second field regions which are adjacent to and parallel to the rows formed by the plurality of the above mentioned first field region, and formed at the same pitch as above. Above-mentioned first and second field regions are formed shifted from each other by $\frac{1}{4}$ pitch in the running direction of the bit lines.

Each of the first and the second field regions includes:

(a) a transfer gate which is provided on the field region;

(b) a pair of source/drain regions which are provided in the main surface of the semiconductor substrate on both sides of the above transfer gate;

(c) a first interlayer insulating film which is provided on the semiconductor substrate to cover the transfer gate;

(d) a bit line contact hole which is provided in the first interlayer insulating film for exposing a surface of one of the source/drain regions;

(e) a bit line which is provided on the first interlayer insulating film to contact one of the above source/drain regions through the above bit line contact hole;

(f) a second interlayer insulating film which is provided on the semiconductor substrate to cover the bit line;

(g) a storage node contact hole which is provided in the second interlayer insulating film for exposing the surface of the other of the source/drain regions;

(h) a storage node which is provided on the second interlayer insulating film to be connected to the other of the above source/drain regions through the above storage node contact hole;

(i) a capacitor insulating film covering the surface of the storage node; and (j) a cell plate which is provided on the semiconductor substrate to cover the storage node with the capacitor insulating film posed therebetween.

According to a preferred embodiment of the present invention, the first and the second field regions are arranged obliquely to the running direction of the bit line.

According to a further preferred embodiment of the present invention, the transfer gate includes a polycide structure in which a high melting point metal silicide is deposited on polycrystalline silicon.

The semiconductor memory device of the present invention having the bit line buried under the cell plate includes a plurality of first field regions which are formed at a predetermined pitch in the running direction of the bit line, and a plurality of second field regions which are formed adjacent to and parallel to the row of the first field regions, and also formed at the same pitch as above. The first field regions and the second field regions are formed shifted from each other by $\frac{1}{4}$ pitch in the running direction of the bit line. More particularly, the field regions are arranged so that the end of the storage node does not appear at the upper portion of the bit line contact hole in case of patterning of the storage node.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
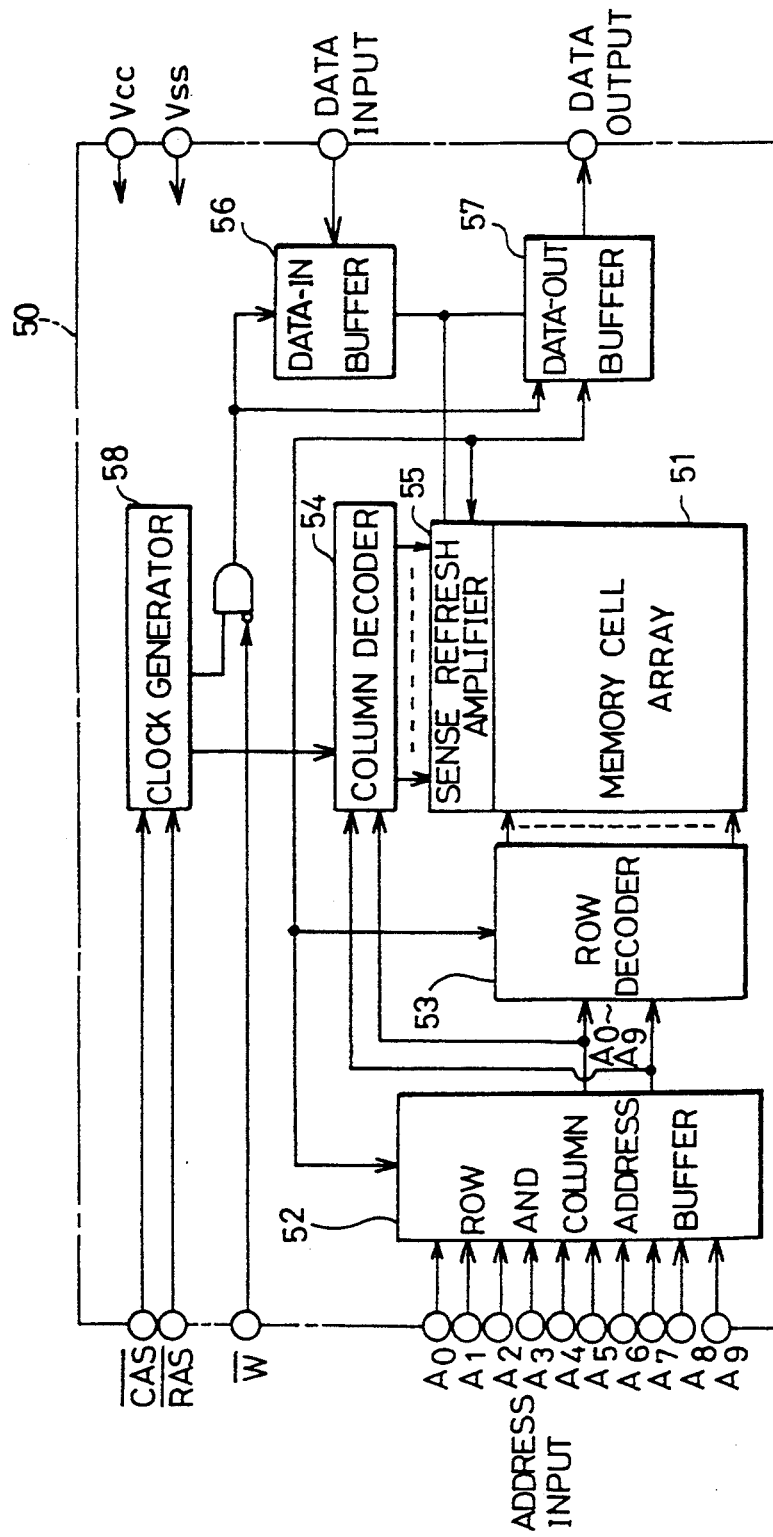
FIG. 1 is a block diagram showing a structure of a general DRAM.
Figure 2:
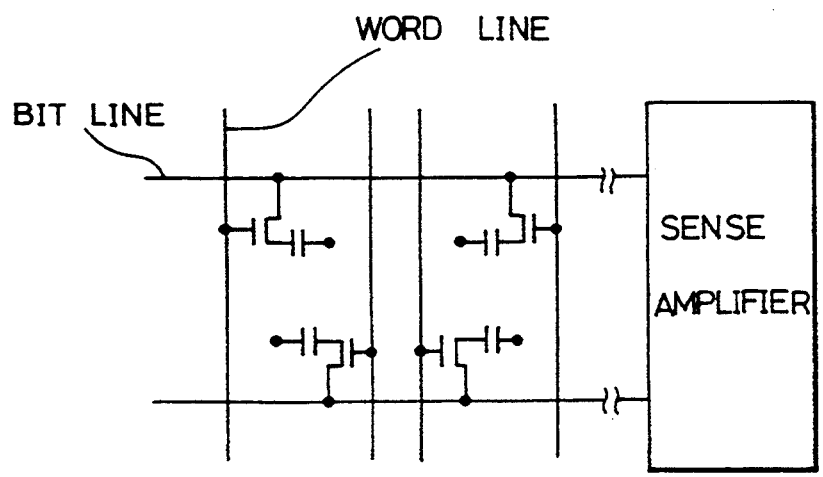
FIG. 2 is an equivalent circuit diagram of a memory cell in a general DRAM.
Figure 3:
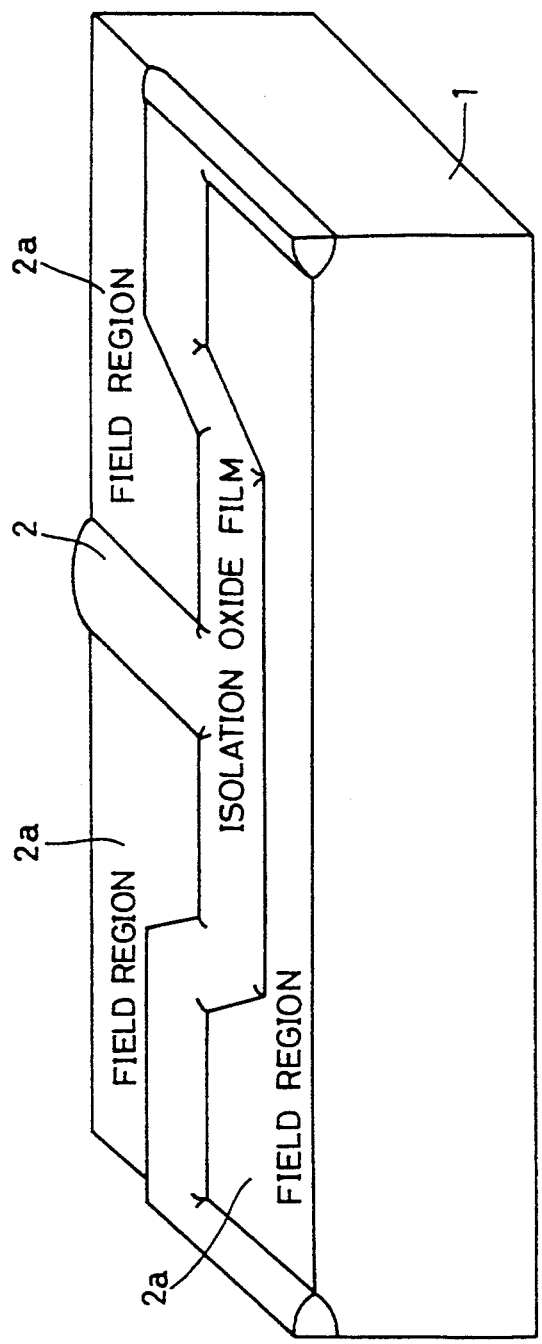
FIG. 3 is a perspective view of silicon substrate 1 having an isolation oxide film formed in its main surface.
Figure 4:
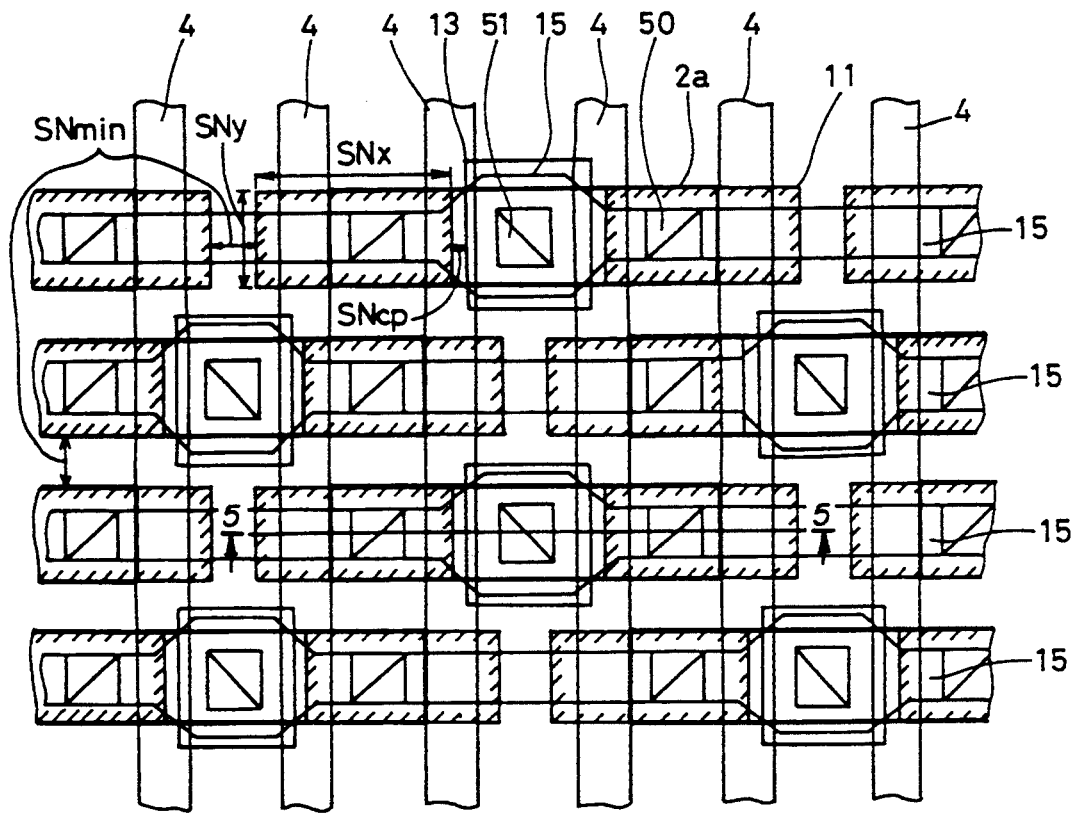
FIG. 4 is a plan view of a semiconductor memory device according to a first conventional example.
Figure 5:
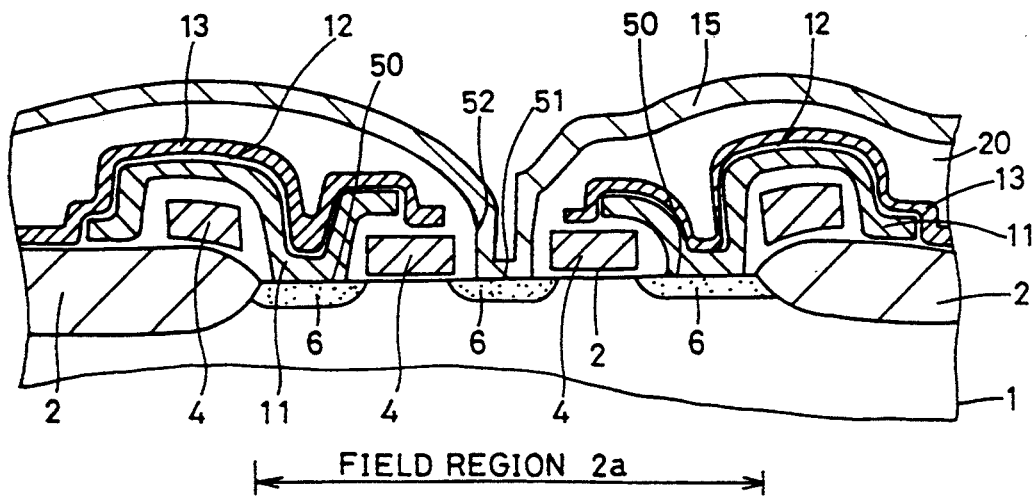
FIG. 5 is a sectional view taken along line A-B in FIG. 4.
Figure 6A:
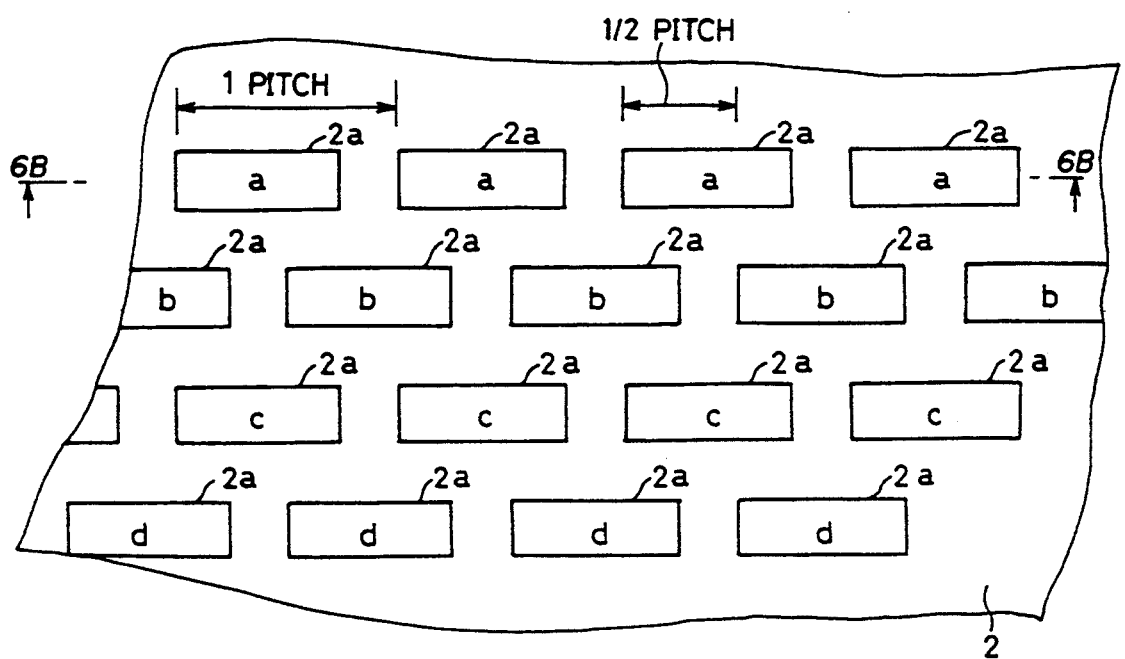
FIGS. 6A and 6B shown the portion of the field regions taken out from the semiconductor memory device shown in FIG. 4, in which 6A is a plan view and 6B is a sectional view taken along line B—B in 6A.
Figure 6B:
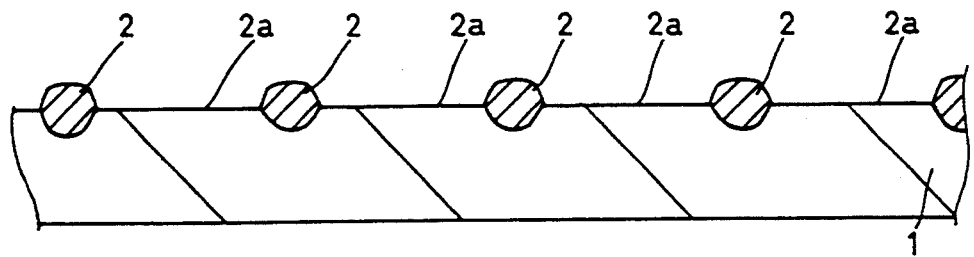
Figure 7:
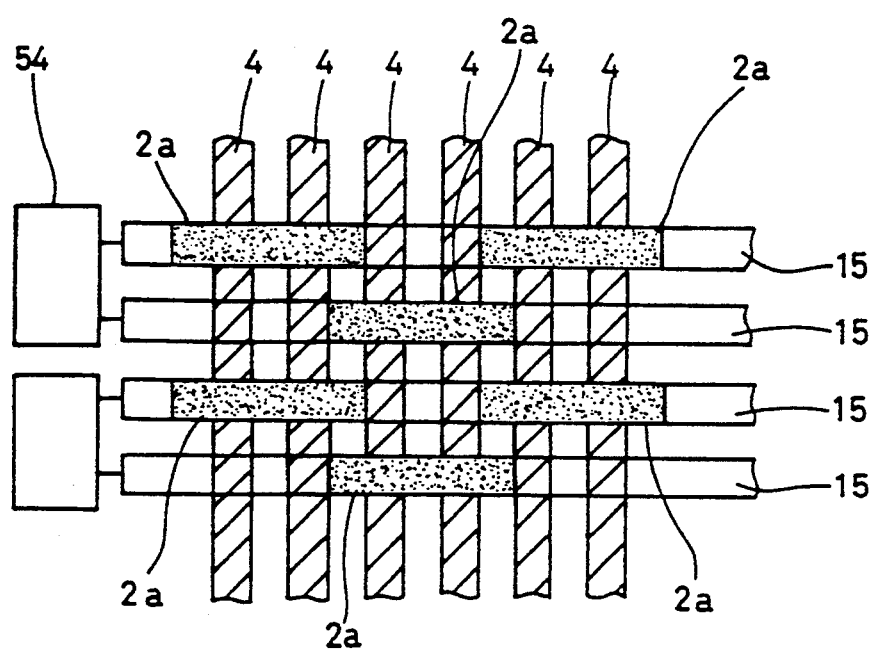
FIG. 7 is a layout of the field regions in the vicinity of a sense amplifier of a close packed folded bit-line cell array in the semiconductor memory device of FIG. 4.
Figure 8:
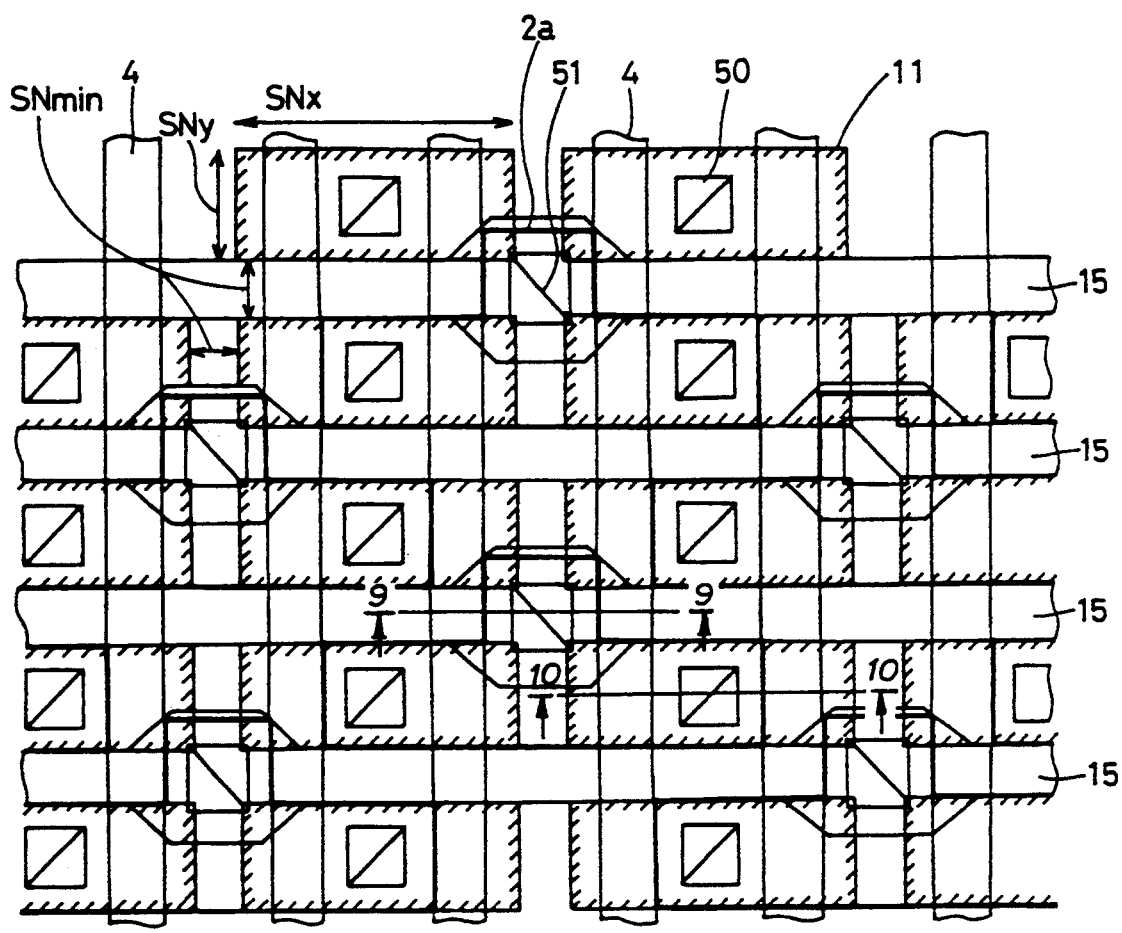
FIG. 8 is a plan view of the semiconductor memory device according to a second conventional example.
Figure 9:
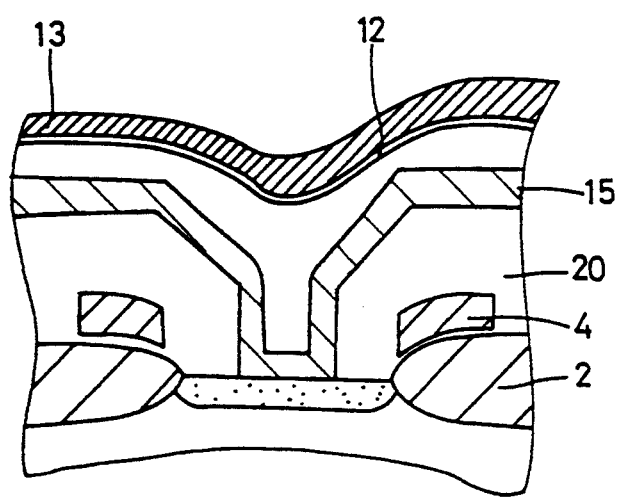
FIG. 9 is a sectional view taken along line A-B in FIG. 8.
Figure 10:
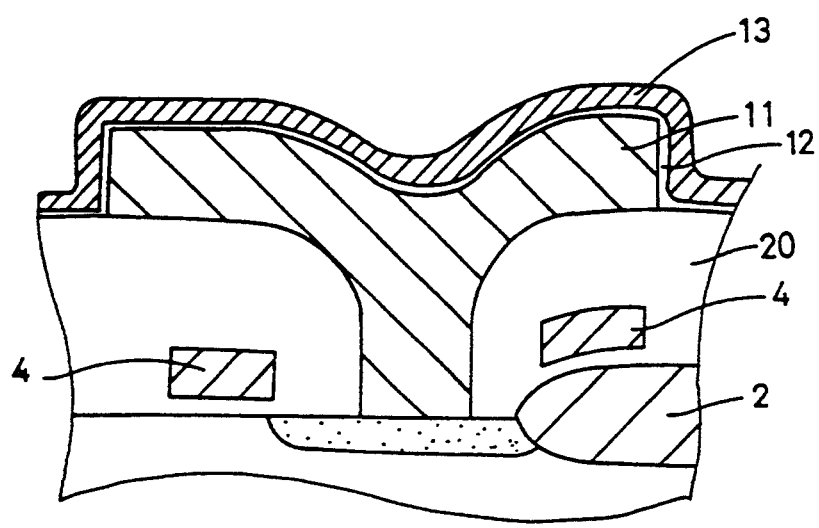
FIG. 10 is a sectional view taken along line C-D in FIG. 8.
Figure 11A:
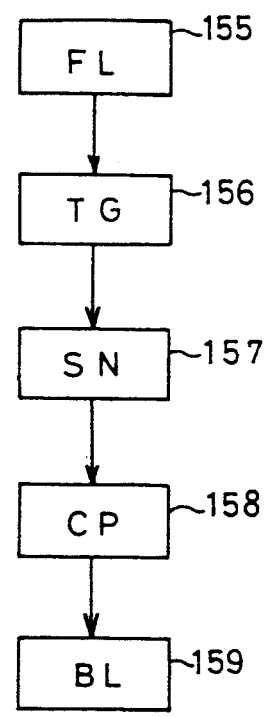
FIG. 11A shows a manufacturing process of the semiconductor memory device not having the bit line buried under the cell plate.
Figure 11B:
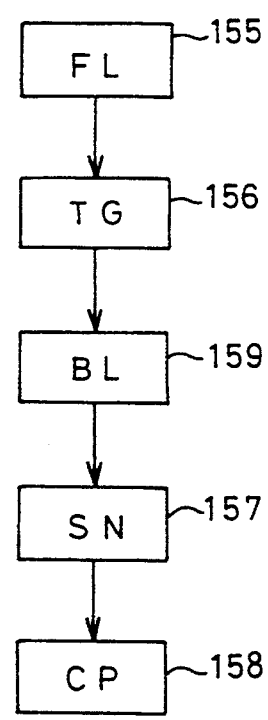
FIG. 11B shows a manufacturing process of the semiconductor memory device having a structure of the bit line buried under the cell plate.
Figure 12:
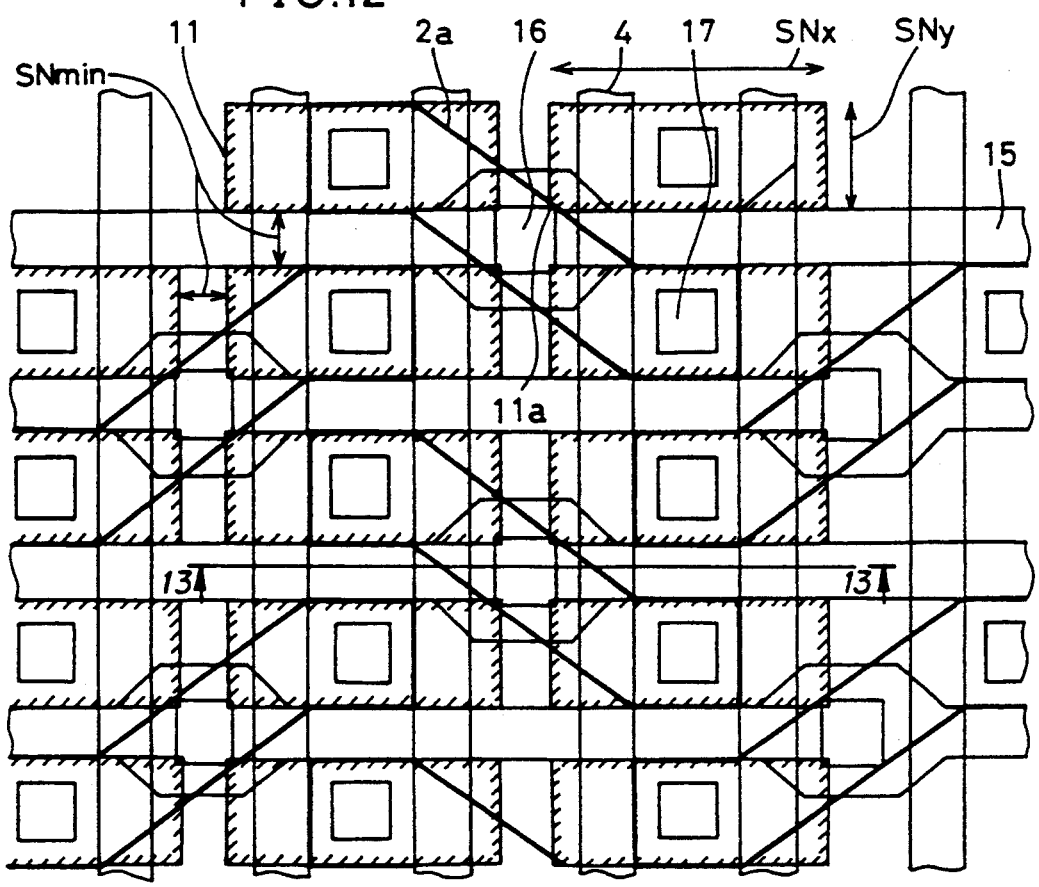
FIG. 12 is a plan view of the semiconductor memory device according to a third conventional example.
Figure 13:
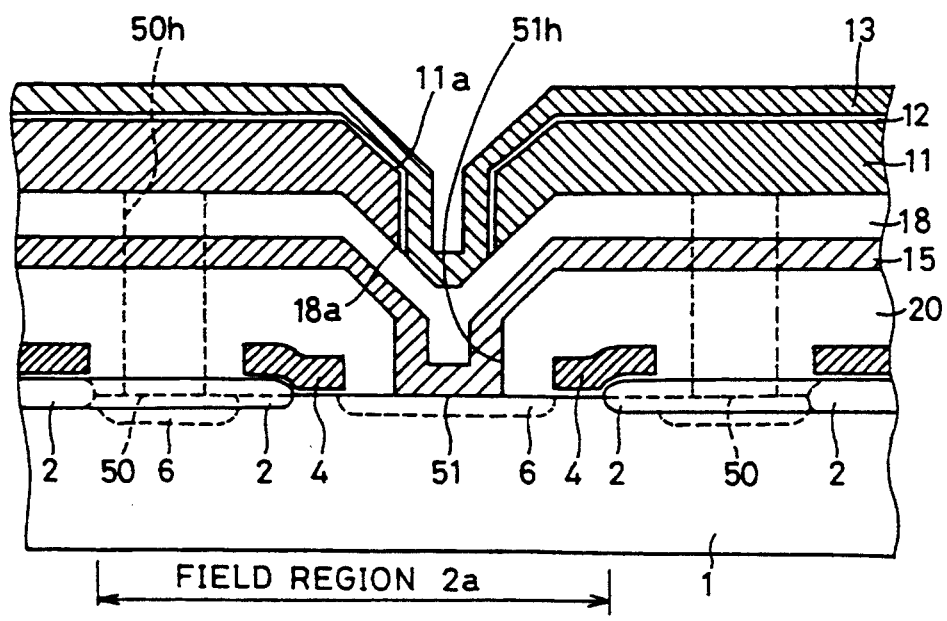
FIG. 13 is a sectional view taken along line A-B in FIG. 12.
Figure 14:
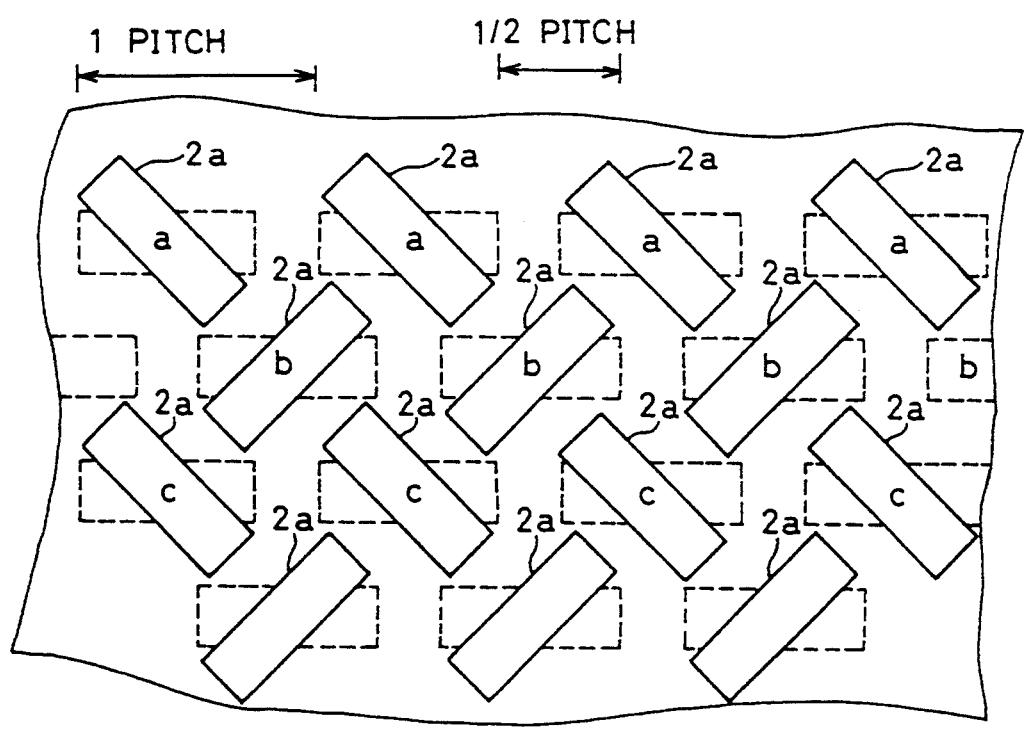
FIG. 14 shows the field regions taken out from the semiconductor memory device shown in FIG. 12.
Figure 15:
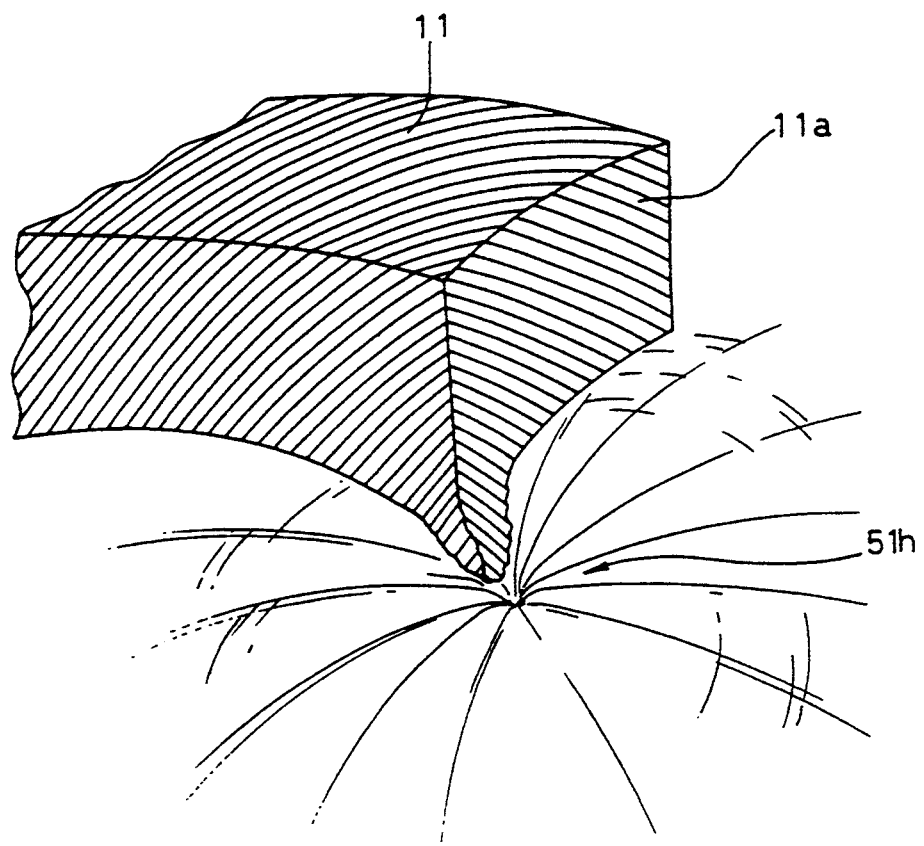
FIG. 15 is a perspective view showing the problem in the major manufacturing process of the semiconductor memory device shown in FIG. 13.
Figure 16:
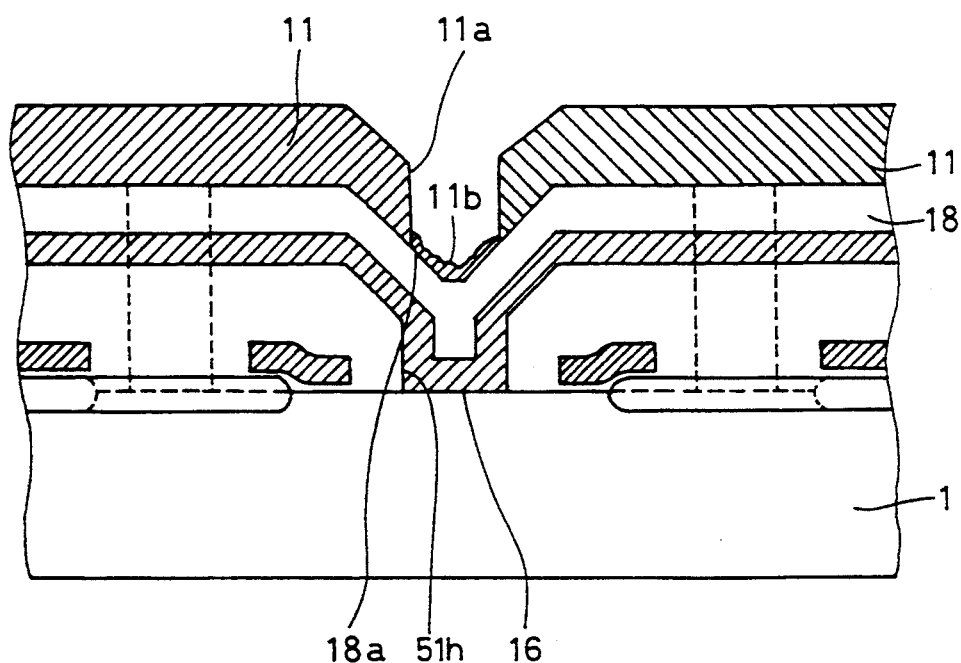
FIG. 16 is a sectional view showing the problem in the major steps of manufacturing the semiconductor memory device shown in FIG. 13.
Figure 17:
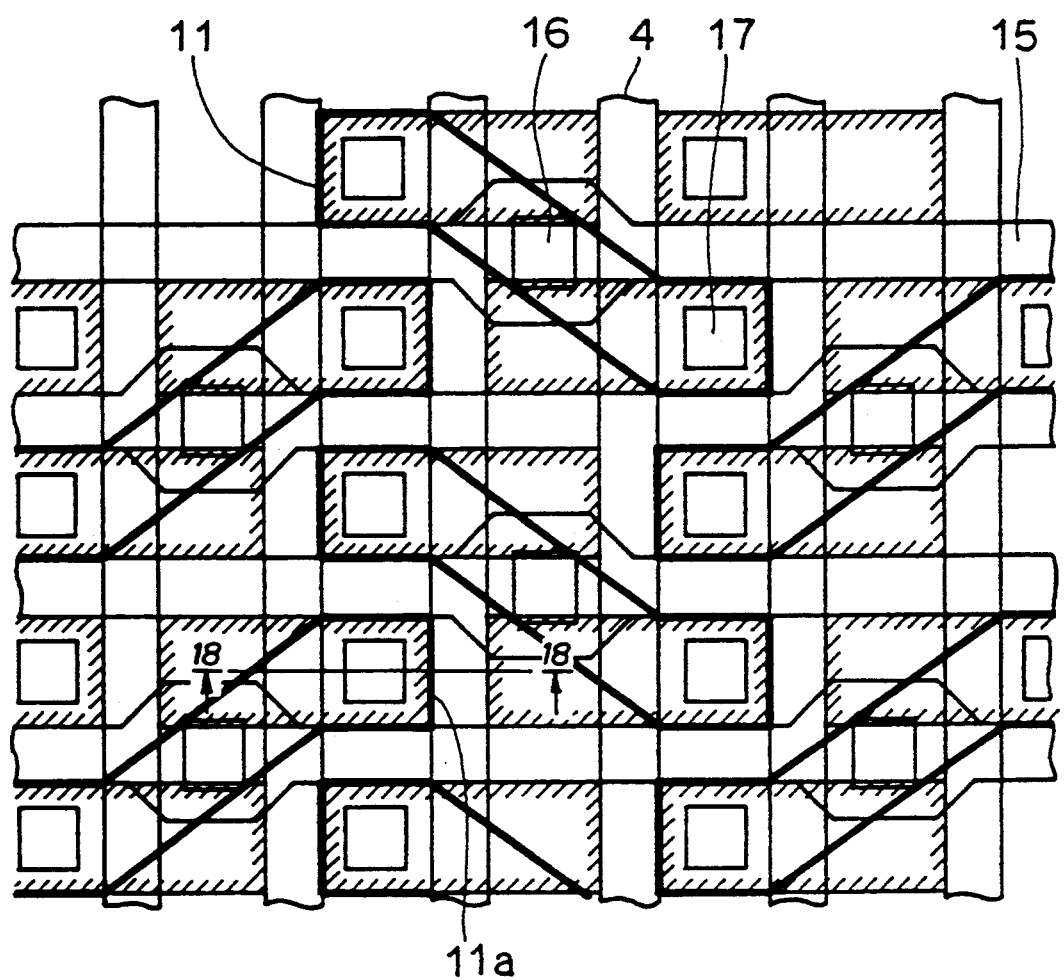
FIG. 17 is a plan view of a modification (storage nodes formed shifted to each other) of the conventional art shown in FIG. 12.
Figure 18:
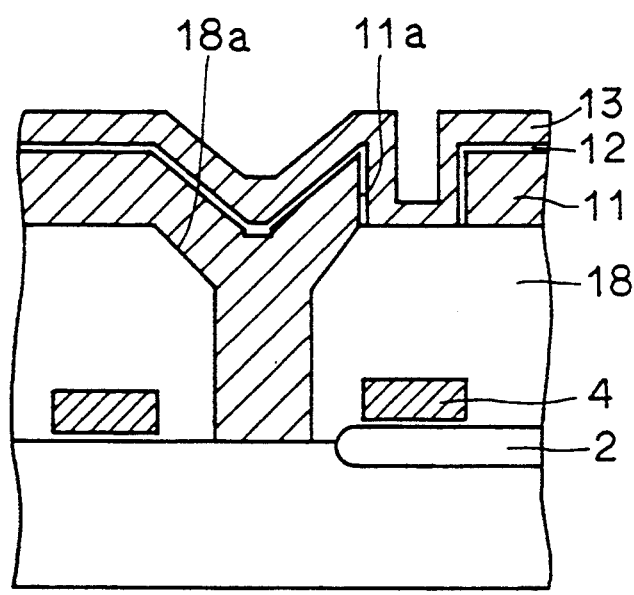
FIG. 18 is a sectional view of FIG. 17 taken along line D—D.
Figure 19:
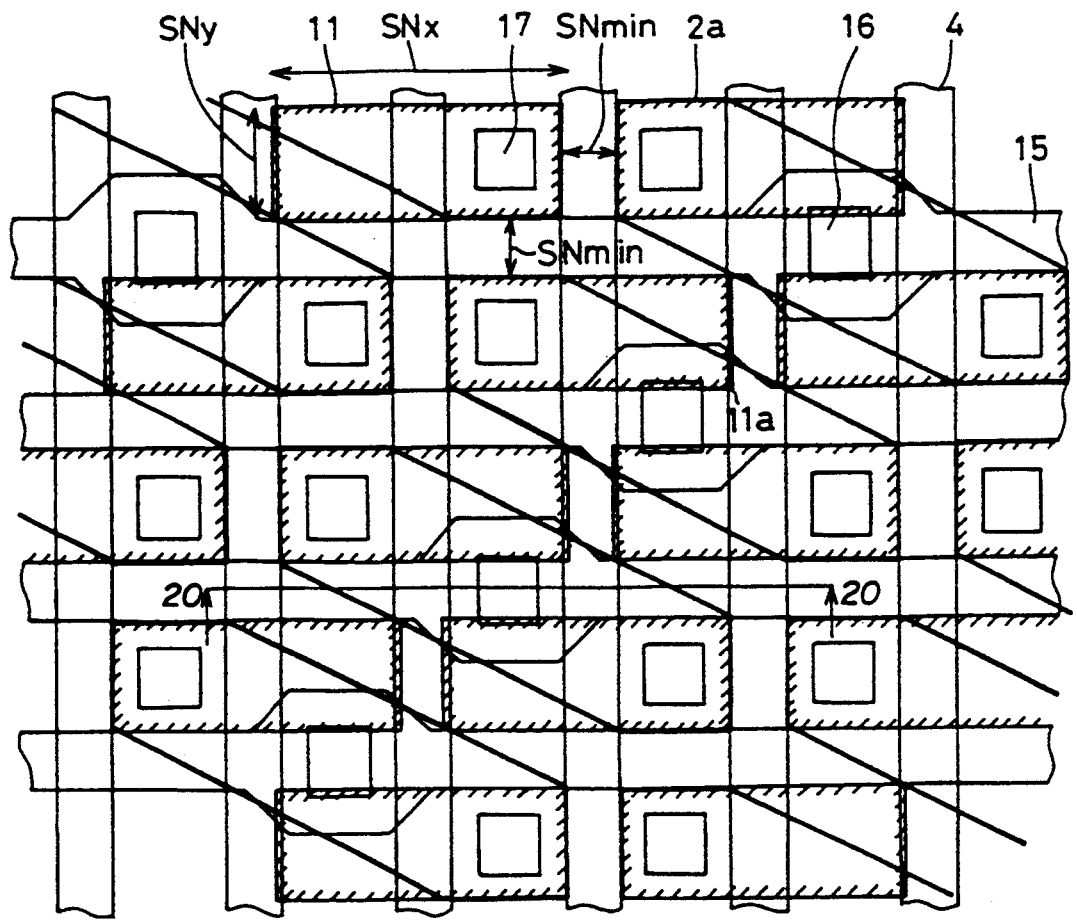
FIG. 19 is a plan view of the semiconductor memory device according to one embodiment of the present invention.
Figure 20:
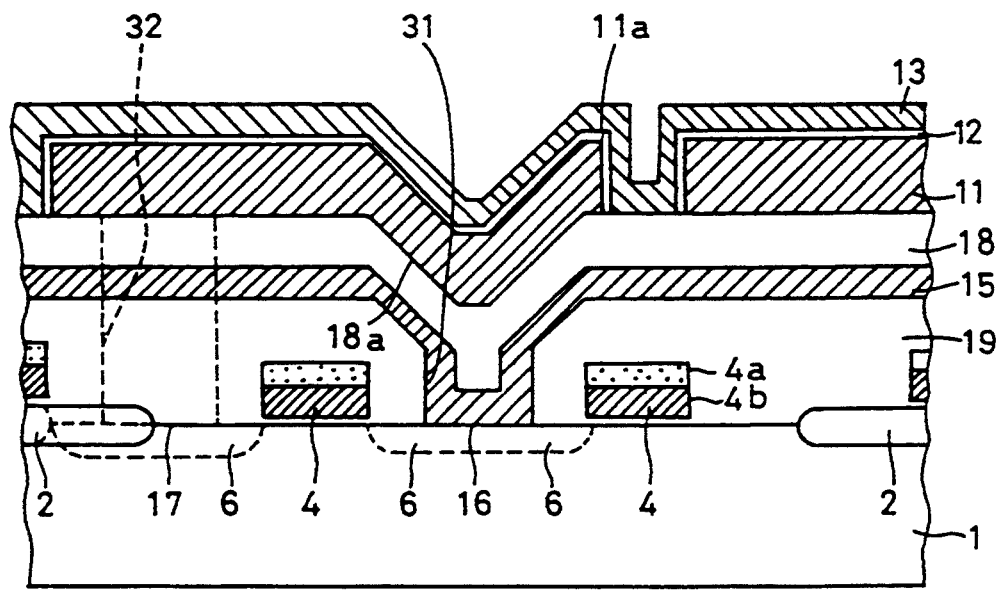
FIG. 20 is a sectional view taken along line B—B in FIG. 19.
Figure 21:
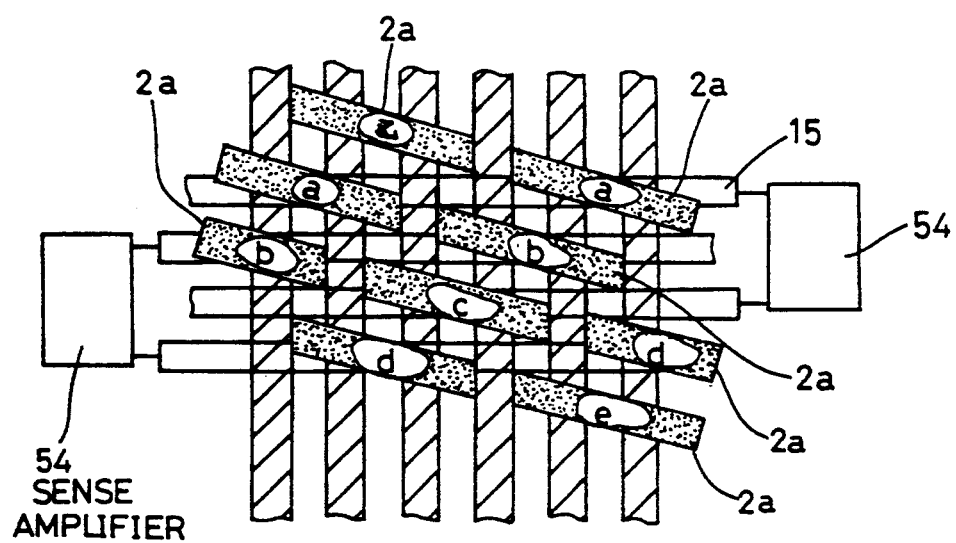
FIG. 21 is a layout of the field regions in the vicinity of the sense amplifier of a close packed folded bit-line cell array in the semiconductor memory device according to the present invention.

FIG. 19 is a plan view of the semiconductor memory device of the buried-bit line type stacked cell structure according to one embodiment of the present invention. FIG. 20 is a sectional view taken along line B—B in FIG. 17. FIG. 21 is a plan view showing the arrangement of the field regions in the vicinity of the sense amplifier of a close packed folded bit-line cell array. In the main surface of silicon substrate 1, a plurality of first field regions 2a shown by (a) are formed at a predetermined pitch in the running direction of bit line 15. A plurality of second field regions 2a shown by (b) are formed adjacent to and parallel to the plurality of first field regions 2a shown by (a) and formed at the same pitch as above. The first field region 2a shown by (a) and the second field region 2a shown by (b) are formed shifted from each other by ¼ pitch in the running direction of bit line 15.

A structure of the semiconductor memory device according to the embodiment will be further described referring to FIG. 20. A transfer gate 4 is provided on field region 2a. A pair of source/drain regions 6, 6 are arranged in the main surface of silicon substrate 1 and on both sides of transfer gate 4. Referring to FIG. 20, source/drain regions 6, 6 are formed to extend obliquely to the running direction of bit line 15.

Transfer gate 4 has a stacked layer structure of polycrystalline silicon film 4b and high melting point metal silicide film 4a. High melting point metal silicide film 4a is made, for example, of $MoSi_2$, $WSi_2$, $TaSi_2$, or $TiSi_2$. A first interlayer insulating film 19 is provided on silicon substrate 1 to cover transfer gate 4.

Bit line contact hole 31 is provided in the first interlayer insulating film 19 in order to expose the surface of one of the source/drain regions 6. Bit line 15 is provided on the first interlayer insulating film 19 to contact one of source/drain regions 6 (bit line contact) through bit line contact hole 31. A second interlayer insulating film 18 is provided on silicon substrate 1 so as to cover bit line 15. Storage node contact hole 32 is provided in the first and the second interlayer insulating films 19 and 18 for exposing the surface of the other source/drain region 6 (storage node contact 17). A patterned storage node 11 is provided on the second interlayer insulating film to be connected to the other source/drain region 6 (storage node contact 17) through storage node contact hole 32. Capacitor insulating film 12 covers the surface of storage node 11. A cell plate 13 is provided over storage node 11 with capacitor insulating film 12 posed therebetween.

Figure 22:
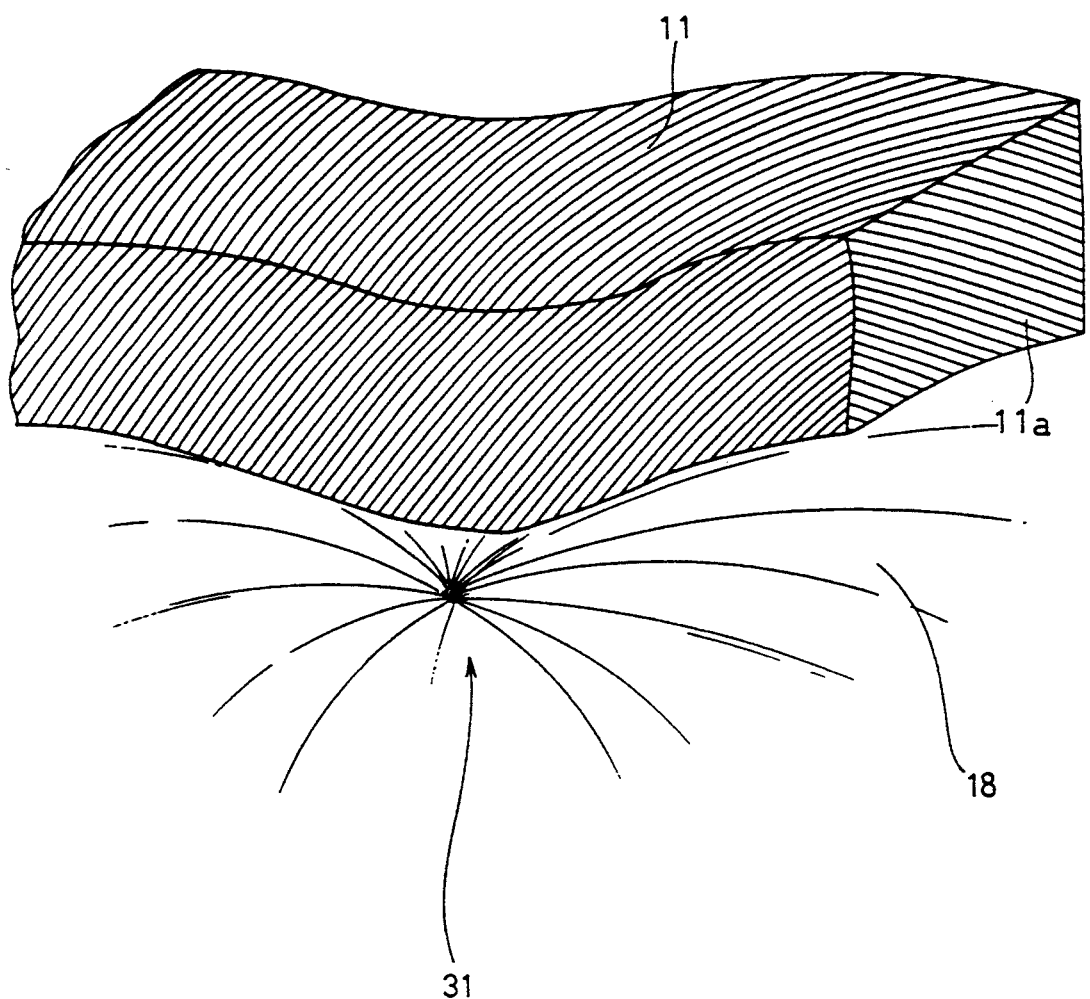
FIG. 22 is a perspective view showing the major steps of manufacturing the semiconductor memory device according to the present invention.

FIG. 22 is an enlarged perspective view showing the vicinity of end 11a of storage node 11.

Referring to FIGS. 19, 20, 21 and 22, since the adjacent rows of the field regions are formed shifted from each other by ¼ pitch, end 11a of storage node 11 will not be formed at the upper portion of bit line contact hole 31 even if the dimensions SNx and SNy are increased to the limit of the processing accuracy of the storage node.

As a result, the surface of interlayer insulating film 18 located underneath end 11a of the storage node 11 will be flat, and accordingly the residue of storage node 11 will not be left behind on interlayer insulating film 18 at the time of patterning of storage node 11.

Also, since gate electrode 4 has a polycide structure, interconnection resistance thereof is low, and thus the signal propagation delay time will be made shorter.

Figure 23:
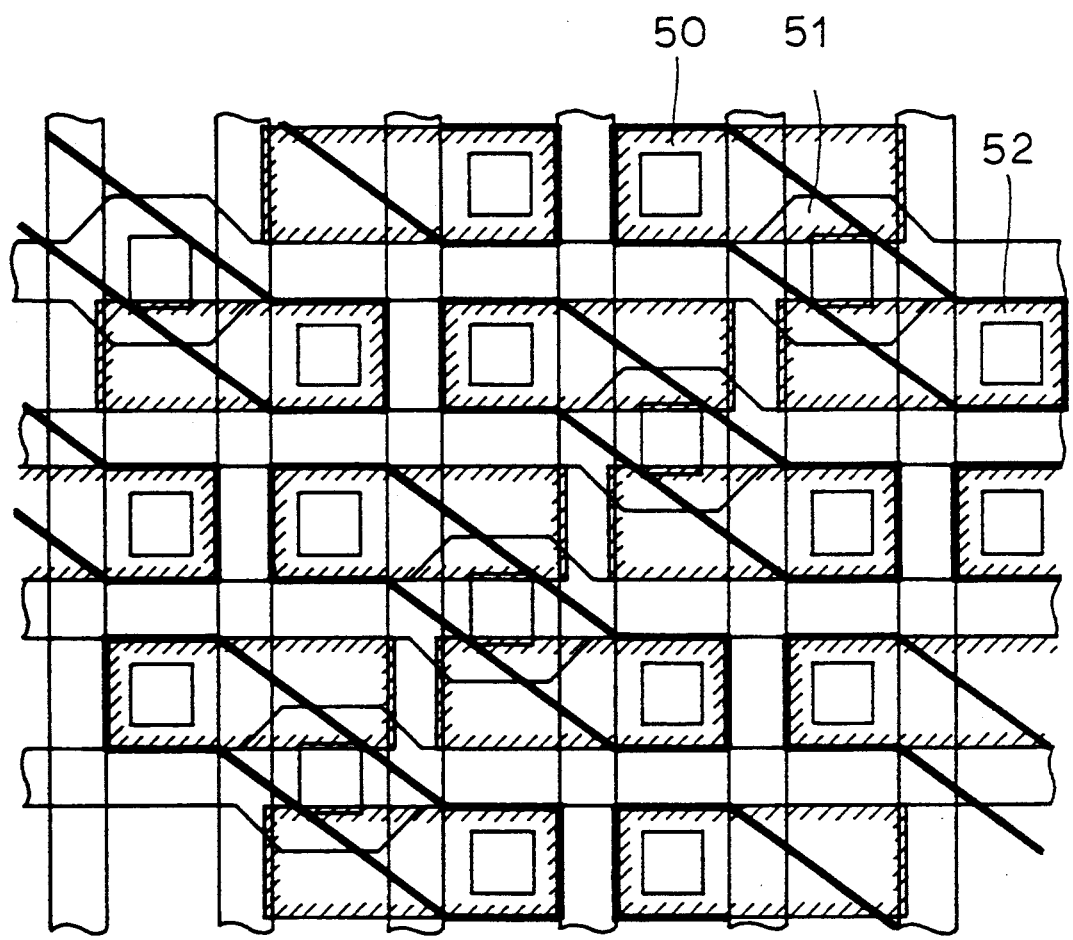
FIG. 23 is a plan view of a modification of the device of the embodiment of FIG. 19.

In the above embodiment referring to FIG. 19, a case was shown where the plane configuration of field region 2a is a hexagon extending in an elongated inclined manner. In this case, storage node contact hole 17 is provided at a portion of the hexagon surrounded by two adjacent sides. In contrast, a possible consideration is that the plane configuration of field region 2a may be an octagon including a tetragon 50, a parallelogram 51, and a tetragon 52 as shown in FIG. 23. However, the formation of a field region 2a in the configuration of FIG. 23 will result in a problem set forth in the following.

Figure 24:
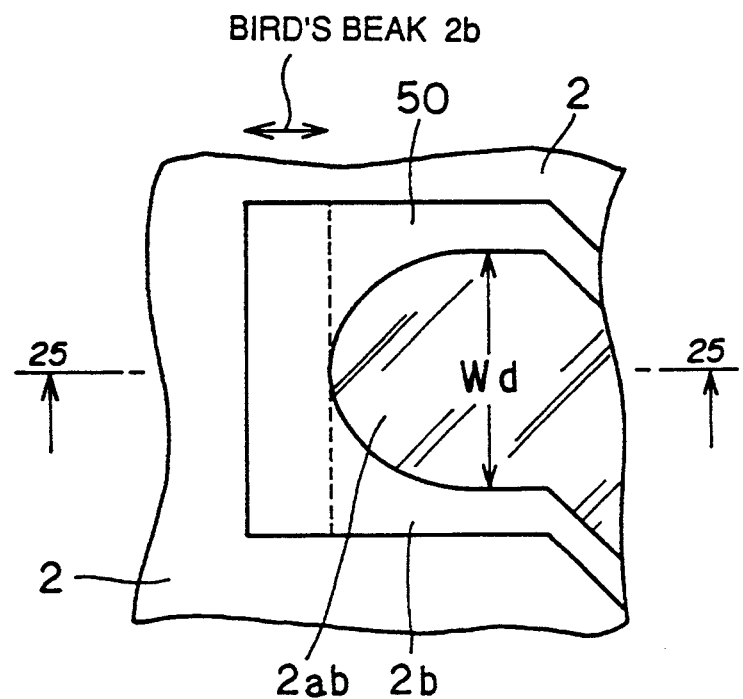
FIG. 24 is a plan view of the vicinity of the end of the field regions of the modification of FIG. 23.
Figure 25:
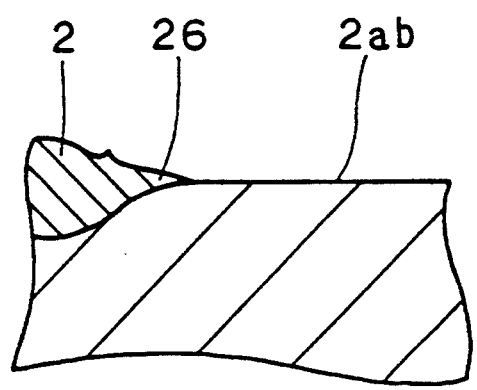
FIG. 25 is a sectional view of FIG. 24 taken along line B—B.
Figure 26:
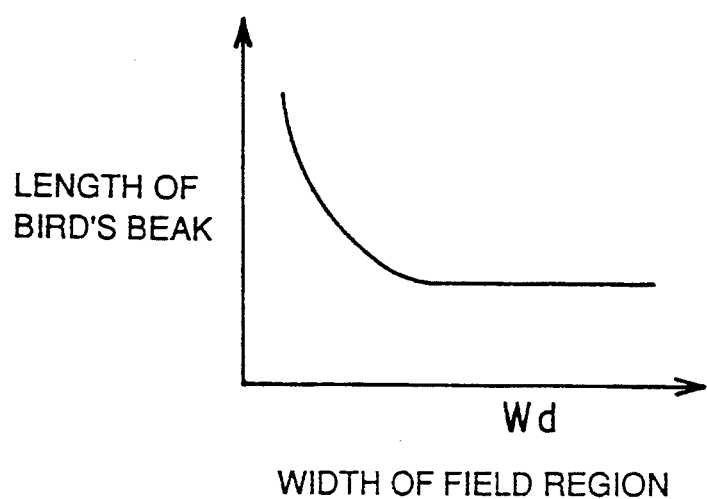
FIG. 26 is a diagram showing the relationship between a width Wd of the field region and the length of the bird's beak.
Figure 27:
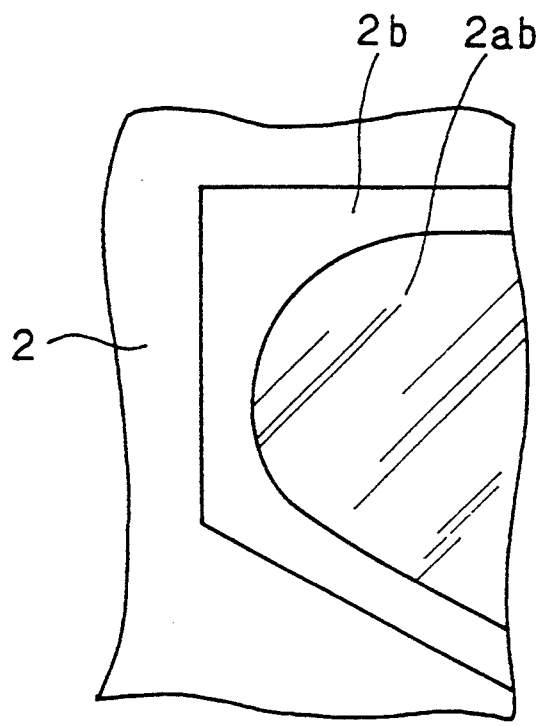
FIG. 27 is a plan view of the vicinity of the end of the field regions of the embodiment of FIG. 19.
Figure 28:
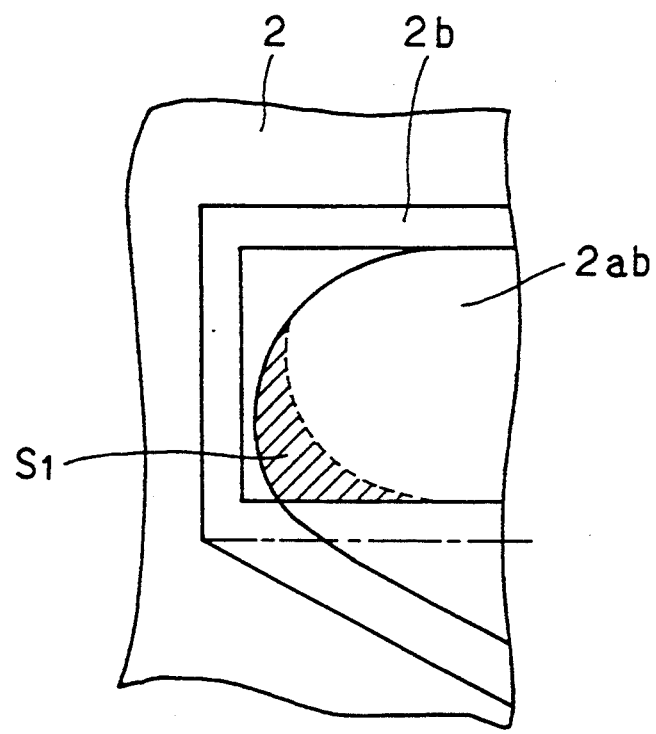
FIG. 28 is a diagram showing the difference between the end portion area of the field region of the semiconductor device of FIG. 19 and the end portion area of the field region of the semiconductor device of FIG. 23.

Referring to FIG. 24, when the configuration of field region 2a is an octagon, end portion 2ab of the field region will be surrounded by three sides by field oxide film 2. Field oxide film 2 has a bird's beak 2b as shown in FIG. 25 (the sectional view taken along line A—A of FIG. 24). Bird's beak 2b becomes greater as the width Wd of the field region becomes smaller as shown in FIGS. 24 and 26. Therefore, when end portion 2ab of the field region is surrounded by three sides by field oxide film 2 as shown in FIG. 24, the area of end portion 2ab of the field region is reduced by the occupying area of bird's beak 2b. In contrast, if the configuration of the field region takes a hexagon, end portion 2ab of the field region is surrounded by two sides by field oxide film 2 as shown in FIG. 27. Therefore, the area of end portion 2ad of the field region when surrounded by two sides is greater than the area of the end portion 2ab of the field region when surrounded by the field oxide film 2 by the area $S_1$ of the shaded portion, as shown in FIG. 28.

Increase in the area of end portion 2ab of the field region means that the diameter of the storage node contact hole formed in end portion 2ab of the field region can be made larger. This allows increase in the contacting area between the storage node and the substrate, resulting in a smaller resistance therebetween. Therefore, the arrangement of the field regions as shown in FIG. 19 provides the advantage of facilitating writing into a memory cell of a DRAM formed in this region in comparison with the case where the arrangement of the field region of FIG. 23 is taken.

Figure 29:
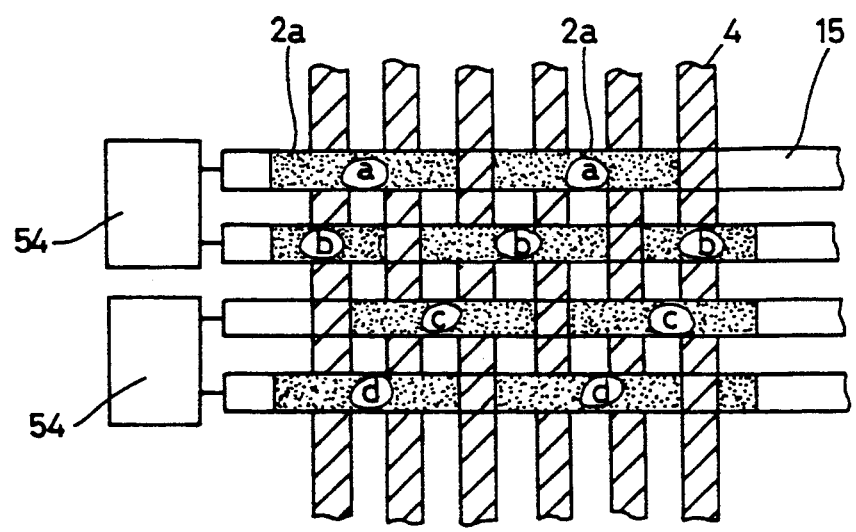
FIG. 29 is a layout of the field pattern according to another embodiment of the present invention.

In the embodiment described above, referring to FIG. 21, field regions 2a are shown arranged obliquely to the running direction of the bit line. However, the present invention is not limited thereto. As shown in FIG. 29, the same effect as the above described embodiment can be obtained when field regions 2a are arranged parallel to the running direction of the bit line 15.

As described above, the semiconductor memory device according to the present invention having the bit line buried under the cell plate includes the plurality of first field regions formed at a predetermined pitch in the running direction of the bit line, and the plurality of second field regions formed adjacent to and parallel to the row of the first field regions and formed at the same pitch as above. The above first field regions and the above second field regions are formed shifted from each other by ¼ pitch in the running direction of the above bit line. In other words, the field regions are arranged so that the end of the storage node does not appear at the upper portion of the bit line contact hole at the time of patterning of the storage node. Therefore, the processing accuracy of the storage node can be improved, and accordingly, semiconductor memory device thus obtained will be highly reliable.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device carrying out input/output of memory information by using a memory cell having a word line serving as a transfer gate, and a bit line serving as a data line, comprising:
   a semiconductor substrate having a main surface;
   a plurality of first field regions isolated from each other by a field oxide film provided in the main surface of said semiconductor substrate, and formed at a predetermined pitch in the running direction of said bit line; and
   a plurality of second field regions formed adjacent to and parallel to rows formed by said plurality of first field regions, and formed at the same pitch as said pitch, wherein
   said first field regions and said second field regions are formed shifted from each other by ¼ pitch in the running direction of said bit line, and
   each of said first and said second field regions includes;
   (a) a transfer gate provided on the field region,
   (b) a pair of source/drain regions provided in the main surface of said semiconductor substrate on both sides of said transfer gate,
   (c) a first interlayer insulating film provided on said semiconductor substrate for covering said transfer gate,
   (d) a bit line contact hole provided in said first interlayer insulating film for exposing the surface of one of said source/drain regions,
   (e) bit line provided on said first interlayer insulating film for contacting one of said source/drain regions through said bit line contact hole,
   (f) a second interlayer insulating film provided on said semiconductor substrate for covering said bit line,
   (g) a storage node contact hole provided in said second interlayer insulating film for exposing the surface of said the other one of source/drain region,
   (h) a storage node provided on said second interlayer insulating film so as to be connected to said the other one of source/drain regions through said storage node contact hole,
   (i) a capacitor insulating film covering the surface of said storage node, and
   (j) a cell plate provided on said semiconductor substrate for covering said storage node with said capacitor insulating film posed therebetween.

2. The semiconductor memory device according to claim 1, wherein the plane configuration of said first and second field regions is a hexagon.

3. The semiconductor memory device according to claim 2, wherein said storage node contact hole is formed in a portion surrounded by two adjacent sides of said hexagon.

4. The semiconductor memory device according to claim 1, wherein said first and second field regions are arranged obliquely to the running direction of said bit line.

5. The semiconductor memory device according to claim 1, wherein said transfer gate has a polycide structure in which a high melting point metal silicide is deposited on polysilicon.

6. The semiconductor memory device according to claim 3, wherein said transfer gate has a polycide structure selected from the group constituting of $MoSi_2$/polySi, $WSi_2$/polySi, $PaSi_2$/polySi and $PiSi_2$/polySi.

7. The semiconductor memory device according to claim 1, wherein said storage node is patterned such that an end of the storage node is located in a region other than the region where said bit line contact hole is formed.

* * * * *